US012735255B2

(12) United States Patent
Mizuno et al.

(10) Patent No.: US 12,735,255 B2
(45) Date of Patent: Sep. 15, 2026

(54) ARTICLE DELIVERY SYSTEM AND METHOD

(71) Applicant: FUJI CORPORATION, Chiryu (JP)

(72) Inventors: Sota Mizuno, Okazaki (JP); Yoshihiro Fujita, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 428 days.

(21) Appl. No.: 18/548,116

(22) PCT Filed: Mar. 12, 2021

(86) PCT No.: PCT/JP2021/010153

§ 371 (c)(1),
(2) Date: Aug. 28, 2023

(87) PCT Pub. No.: WO2022/190374

PCT Pub. Date: Sep. 15, 2022

(65) Prior Publication Data

US 2024/0132285 A1 Apr. 25, 2024
US 2024/0228164 A9 Jul. 11, 2024

(51) Int. Cl.
*B65G 1/04* (2006.01)
*B66F 9/19* (2006.01)
*H05K 13/02* (2006.01)

(52) U.S. Cl.
CPC .............. *B65G 1/0492* (2013.01); *B66F 9/19* (2013.01); *H05K 13/02* (2013.01)

(58) Field of Classification Search
CPC ......... B65G 1/0492; B66F 9/19; H05K 13/02; H05K 13/021; H05K 13/0888
See application file for complete search history.

(56) References Cited

U.S. PATENT DOCUMENTS

2004/0182683 A1 * 9/2004 Bigelow ................ B65G 43/10 198/781.05
2020/0396874 A1 * 12/2020 Ohori ...................... B66F 9/063
2024/0015942 A1 * 1/2024 Matsushita .......... H05K 13/043

FOREIGN PATENT DOCUMENTS

JP 9-140002 A 5/1997
JP H09140002 A * 5/1997

(Continued)

OTHER PUBLICATIONS

International Search Report issued May 25, 2021 in PCT/JP2021/010153, filed on Mar. 12, 2021, 3 pages.

*Primary Examiner* — Vincent H Tran
(74) *Attorney, Agent, or Firm* — Oblon, McClelland, Maier & Neustadt, L.L.P.

(57) ABSTRACT

When an article is delivered between a first electric conveyor of an automated guided vehicle and a second electric conveyor of a storage section, a first communication module of the automated guided vehicle and a second communication module of the storage section exchange signals, power supply to the first electric conveyor is shut off in response to a first emergency stop switch of the automated guided vehicle, a first signal from the first communication module changes, and power supply to the second electric conveyor is shut off in response to a change in the first signal, and the power supply to the second electric conveyor is shut off in response to a second emergency stop switch of the storage section, a second signal from the second communication module changes, and the power supply to the second electric conveyor is shut off in response to the second signal.

9 Claims, 8 Drawing Sheets

(56) References Cited

FOREIGN PATENT DOCUMENTS

| | | | |
|---|---|---|---|
| JP | 2001-88080 | A | 4/2001 |
| JP | 2015-76536 | A | 4/2015 |
| WO | WO 2017/141365 | A1 | 8/2017 |

* cited by examiner 4
45
44
46
47
41
42
4co
48
100
110
112
114
110co
W 4
4io
4sw
4co
I/O MODULE
OPTICAL COMMUNI-CATION MODULE
L1
L2
4R
4L
CONTROL DEVICE
CONVEYOR DRIVING DEVICE
POWER SUPPLY
49
40
43
FEEDER
50
90
110
110io
110sw
110co
I/O MODULE
OPTICAL COMMUNI-CATION MODULE
Lb
La
110R
110L
CONVEYOR CONTROL DEVICE
CONVEYOR DRIVING DEVICE
115
111
100
TRAVELING CONTROL DEVICE
TRAVELING DRIVING DEVICE
BATTERY
105
101
109

110
100
115
111
110io
I/O MODULE
CONVEYOR CONTROL DEVICE
CONVEYOR DRIVING DEVICE
TRAVELING CONTROL DEVICE
105
110sw
Lb
TRAVELING DRIVING DEVICE
101
La
110co
OPTICAL COMMUNI-CATION MODULE
110R
110L
BATTERY
109
4co
OPTICAL COMMUNI-CATION MODULE
49
POWER SUPPLY
FEEDER
50
L2
4R
4sw
L1
4L
4io
I/O MODULE
CONTROL DEVICE
CONVEYOR DRIVING DEVICE
4
40
43
90

4
4io
I/O MODULE
40
CONTROL DEVICE
43
CONVEYOR DRIVING DEVICE
L1
4sw
4L
4R
L2
49
POWER SUPPLY
4co
OPTICAL COMMUNI-CATION MODULE
90
50
FEEDER
50
FEEDER
50
FEEDER
110co
OPTICAL COMMUNI-CATION MODULE
110R
110L
La
110sw
Lb
110io
I/O MODULE
115
CONVEYOR CONTROL DEVICE
111
CONVEYOR DRIVING DEVICE
110
100
109
BATTERY
101
TRAVELING DRIVING DEVICE
105
TRAVELING CONTROL DEVICE

ARTICLE DELIVERY SYSTEM AND METHOD

TECHNICAL FIELD

The present disclosure relates to an article delivery system and method for delivering an article between an automated guided vehicle for conveying the article and a storage section for storing the article.

BACKGROUND ART

Conventionally, a transfer safety control method for transferring a conveyed article between an automated guided vehicle having an automated vehicle side optical communicator and an automated vehicle side control section, and a ground facility having a ground side optical communicator and a ground side control section is known (for example, refer to Patent Literature 1). In this method, in a case where the power supply of the automated guided vehicle is turned off in response to a command such as an emergency stop during the transfer of the conveyed article, the automated vehicle side control section causes the automated vehicle side optical communicator to output an automated vehicle side driving preparation cancellation optical signal. In addition, in a case where the power supply of the ground facility is turned off, the ground side control section causes the ground side optical communicator to output a ground side driving preparation cancellation optical signal. In a case where the automated vehicle side optical communicator receives the ground side driving preparation cancellation optical signal, the automated vehicle side control section shuts down the power supply of the automated guided vehicle, and in a case where the ground side optical communicator receives the automated vehicle side driving preparation cancellation optical signal, the ground side control section shuts down the power supply of the ground facility. As a result, in a case where the power supply of a first one of the automated guided vehicle and the ground facility is turned off, the power supply of a second one of the automated guided vehicle and the ground facility is automatically turned off.

In addition, conventionally, a mobile robot system is known in which a mobile robot moves between facilities and stops in front of each facility to perform work (for example, refer to Patent Literature 2). The facility of the system includes an external operation panel located outside a work area of the mobile robot and having a driving preparation switch, an emergency stop switch, and the like, and a connection electrode section electrically connected to the external operation panel. In addition, the mobile robot includes a connected electrode section that is detachably connected to the connection electrode section at a stop position in front of the facility, a driving preparation circuit that supplies power supply for power to a driving section of the mobile robot, such as a robot arm, a traveling mechanism, and an air supply source, and an operation panel having a driving preparation switch, an emergency stop switch, and the like. When the driving preparation switch of the external operation panel or the mobile robot is turned on in a state where the connected electrode section is connected to the connection electrode section, the driving preparation circuit of the mobile robot supplies power supply for power to the driving section. In addition, when the emergency stop switch of the external operation panel or the mobile robot is turned on in a state where the connected electrode section is connected to the connection electrode section, the driving preparation circuit shuts off the power supply for power to the driving section. As a result, safety, when the mobile robot is caused to perform the work, is secured.

PATENT LITERATURE

Patent Literature 1: JP-A-H9-140002
Patent Literature 2: JP-A-2001-88080

BRIEF SUMMARY

Technical Problem

However, as in the method described in Patent Literature in a case where the power supply of the second one of the automated guided vehicle and the ground facility is turned off in response to the power supply failure of the first one, there is a possibility that the conveyed article may fall due to the stoppage of all the functions of the second one, or the subsequent recovery work may be complicated. In addition, the technique described in Patent Literature 2 is merely a technique capable of stopping the power supply from both the mobile robot and the external operation panel that are electrically connected to each other to the driving source of the mobile robot, and cannot improve the safety of a delivery work of the article between the automated guided vehicle and the storage section that stores the article and recovery efficiency after the emergency stop.

Accordingly, it is a principal object of the present disclosure to improve safety of a delivery work of an article between an automated guided vehicle and a storage section that stores the article and recovery efficiency after an emergency stop.

Solution to Problem

According to an aspect of the present disclosure, there is provided an article delivery system for delivering an article used in production of a board on which a component is mounted between an automated guided vehicle configured to convey the article and a storage section configured to store the article, the system including a first electric conveyor provided on a side of the automated guided vehicle, and configured to deliver the article between the first electric conveyor and the storage section, a first communication module provided on the side of the automated guided vehicle, and configured to transmit a first signal to a side of the storage section, a first emergency stop switch provided on the side of the automated guided vehicle, a second electric conveyor provided on the side of the storage section, and configured to deliver the article between the second electric conveyor and the first electric conveyor of the automated guided vehicle, a second communication module provided on the side of the storage section, and configured to transmit a second signal to the side of the automated guided vehicle, and a second emergency stop switch provided on the side of the storage section, in which the first and second communication modules are configured to exchange signals with each other, power supply to the first electric conveyor is shut off and the first signal from the first communication module changes in response to operation of the first emergency stop switch, power supply to the second electric conveyor is shut off and the second signal from the second communication module changes in response to operation of the second emergency stop switch, the power supply to the second electric conveyor is shut off in response to a change in the first signal from the first communication module, and the power supply to the first electric conveyor is shut off in response to a change in the second signal from the second communication module.

In the article delivery system of the present disclosure, in response to the operation of the first emergency stop switch on the side of the automated guided vehicle, the power supply to the first electric conveyor is shut off, the first signal from the first communication module changes, and the power supply to the second electric conveyor is shut off in response to the change in the first signal from the first communication module. In addition, in response to the operation of the second emergency stop switch on the side of the storage section, the power supply to the second electric conveyor is shut off, the second signal from the second communication module changes, and the power supply to the first electric conveyor is shut off in response to the change in the second signal from the second communication module. As a result, both the first electric conveyor on the side of the automated guided vehicle and the second electric conveyor on the side of the storage section can be stopped in response to the operation of any one of the first emergency stop switch on the side of the automated guided vehicle and the second emergency stop switch on the side of the storage section. As a result, it is possible to satisfactorily suppress the unexpected movement of the article during the emergency stop, and to further improve the safety of the delivery work of the article between the automated guided vehicle and the storage section. Furthermore, by stopping both the first and second electric conveyors in response to the operation of any one of the first and second emergency stop switches, it is possible to continuously operate any device (control device or the like) of the automated guided vehicle or the storage section while securing safety, and to improve the recovery efficiency after the emergency stop.

DESCRIPTION OF EMBODIMENTS

Next, embodiments of the present disclosure will be described with reference to the drawings.

Figure 1:
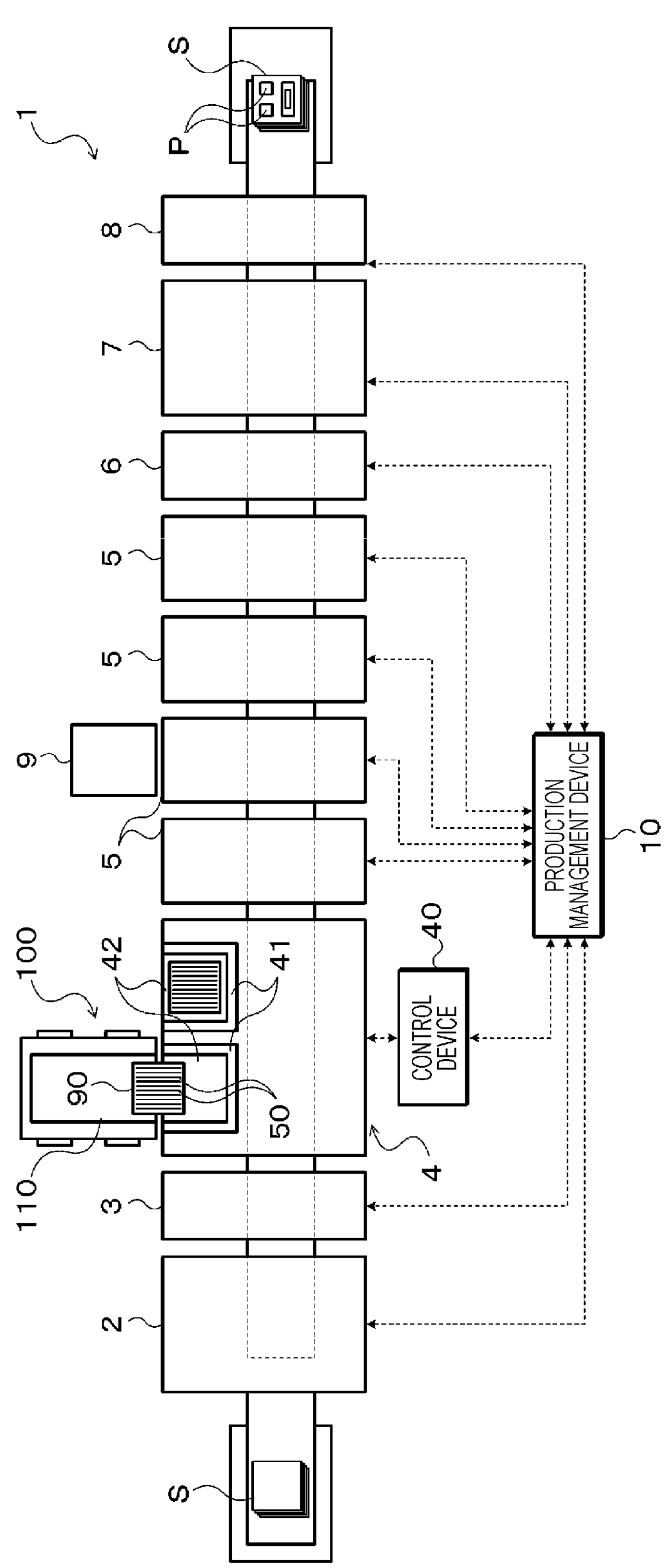
FIG. 1 is a schematic configuration diagram illustrating a production line including an article delivery system of the present disclosure.

FIG. 1 is a schematic configuration diagram illustrating production line 1 including an article delivery system of the present disclosure. Production line 1 illustrated in the drawing is for producing board S on which component P is mounted, and includes printing device 2, print inspection device 3, storage section (buffer station) 4, multiple (for example, four in the present embodiment) component mounters 5, mounting inspection device 6, reflow device 7, reflow inspection device 8, production management device (control device) 10 for managing and controlling an entire line, and the like. Printing device 2, print inspection device 3, storage section 4, multiple component mounters 5, mounting inspection device 6, reflow device 7, and reflow inspection device 8 are arranged in this order along a predetermined conveyance direction of board S.

Printing device 2 is a device for printing solder on a wiring pattern of board S, and includes a board conveyance device for conveying board S, a printing head, a head moving device for moving the printing head, a fixed frame to which a screen mask is fixed, a control device (none illustrated) that is a computer including CPU, ROM, RAM, a storage device, and the like. Print inspection device 3 is for inspecting the state of the solder printed on board S by printing device 2, and includes an inspection mechanism, a control device (computer) for controlling the inspection mechanism, and the like. The control devices of printing device 2 and print inspection device 3 mutually exchange information with production management device 10 via wireless or wired communication, respectively.

Storage section 4 is incorporated between print inspection device 3 and component mounter 5 on the most upstream side in production line 1, and constitutes an article delivery system of the present disclosure together with automated guided vehicle (AGV) 100. In storage section 4, multiple articles to be used for the production of board S on which component P is mounted are temporarily stored in order to improve production efficiency in production line 1. In the present embodiment, the article stored in storage section 4 is feeder 50 mounted on each component mounter 5. In addition, storage section 4 includes control device 40 that manages stored feeder 50 and controls various devices, and multiple storage spaces 41 (two in the present embodiment). Control device 40 is a computer including CPU, ROM, RAM, a storage device, and the like, and mutually exchanges information with production management device 10 via wireless or wired communication. In addition, in each storage space 41, electric conveyor (second electric conveyor) 42 for delivering the article to and from automated guided vehicle 100 under the control of control device 40 is installed. Multiple feeders 50 expected to be mounted on component mounter 5 (before use) are stored in first storage space 41, and multiple used feeders 50 detached from component mounter 5 are stored in second storage space 41.

Figure 2:
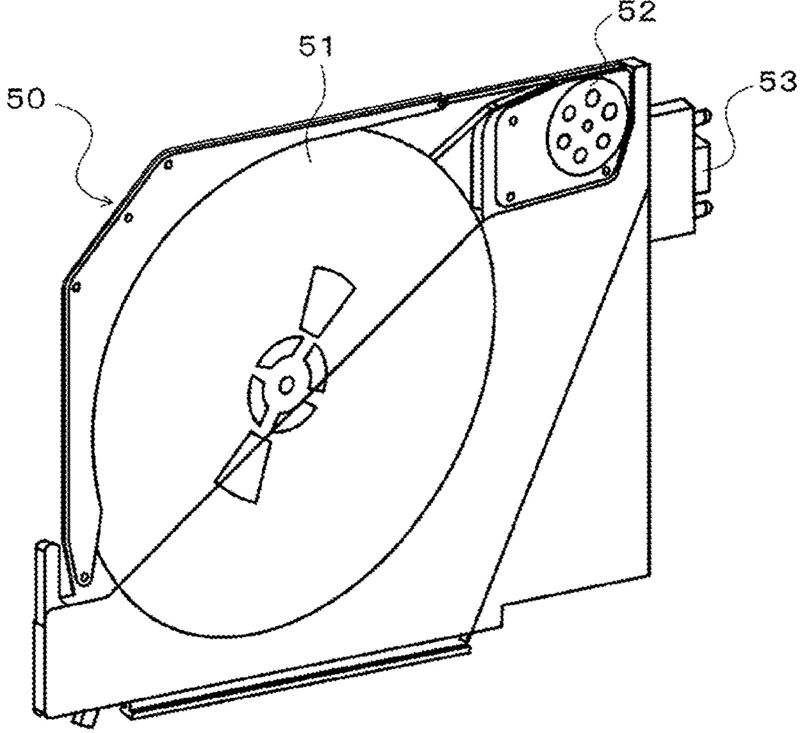
FIG. 2 is a perspective view illustrating a feeder mounted on a component mounter included in the production line in FIG. 1.

As illustrated in FIG. 2, feeder 50 is a cassette-type tape feeder and includes tape reel 51, tape feeding mechanism 52, connector 53, and a feeder control device (not illustrated) for controlling tape feeding mechanism 52. A tape accommodating multiple components P is wound on tape reel 51. In each tape reel 51, multiple components P are each protected by a film covering the surface of the tape, and the film is peeled off before component P reaches a component supply position in component mounter 5. Tape feeding mechanism 52 pulls the tape out from tape reel 51 and feeds the tape to the component supply position. The feeder control device includes a microcomputer or the like having CPU, ROM, RAM, and the like.

Figure 3:
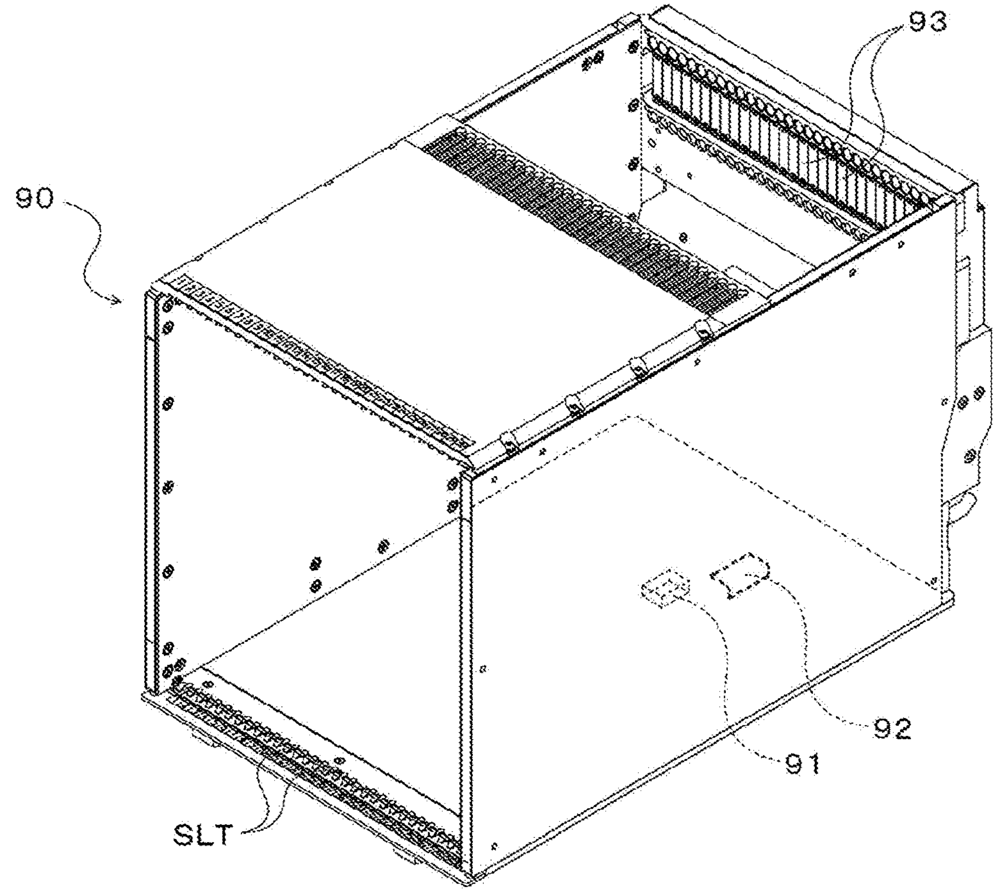
FIG. 3 is a perspective view illustrating an accommodation case used for delivering an article in the article delivery system of the present disclosure.

In addition, in the present embodiment, box-shaped accommodation case (pallet) 90 as illustrated in FIG. 3 is used to collectively deliver multiple feeders 50 between storage section 4 and automated guided vehicle 100. Accommodation case 90 includes multiple (for example, 30) slots SLT into which each of feeders 50 is inserted, clamped member 91 clamped by electric conveyor 42 of storage section 4, detected member 92 used for detecting a position of accommodation case 90, and multiple (for example, 30) connectors 93 that can be coupled to each of connectors 53 of corresponding feeder 50. Clamped member 91 is formed in a rectangular parallelepiped shape, for example, and protrudes downward in FIG. 3 from a bottom surface of accommodation case 90. Detected member 92 includes a thin plate-shaped protruding portion protruding downward in FIG. 3 from the bottom surface of accommodation case 90 on the side of multiple connectors 93 from clamped member 91.

Multiple feeders 50 (for example, 30) are inserted into corresponding slots SLT so that connector 53 is coupled to corresponding connectors 93, and are accommodated in accommodation case 90. Furthermore, accommodation case 90 has an external connector (not illustrated) that is connected to multiple connectors 93 and can be coupled to connector 46 (refer to FIG. 4 and the like) provided in storage space 41 of storage section 4, and each feeder 50 is connected to control device 40 of storage section 4 and the power supply of storage section 4 (not illustrated) via corresponding connector 93 and the external connector. As a result, each feeder 50 and control device 40 can communicate with each other, and the feeder information of each feeder 50 can be fetched into control device 40. The feeder information includes information such as the ID of feeder 50, the ID of tape reel 51 included in feeder 50, the component type and the remaining number of components (state of feeder 50), and the number of slot SLT on which feeder 50 is mounted (position of feeder 50). Multiple feeders 50 accommodated in one accommodation case 90 may accommodate different components from each other, or may accommodate the same components as each other.

Furthermore, production line 1 includes loader 9 that moves along the conveyance direction of board S to deliver feeder 50 between storage section 4 and multiple component mounters 5. That is, loader 9 collects used multiple feeders 50 from corresponding component mounter 5 and stores used multiple feeders 50 in accommodation case 90 stored in second storage space 41 of storage section 4. In addition, loader 9 takes out multiple feeders 50 before use from first storage space 41 (accommodation case 90) of storage section 4, and mounts multiple feeders 50 on corresponding component mounter 5.

Any of multiple component mounters 5 is a surface mounter capable of picking up component P from a tape fed by feeder 50 and mounting component P on board S, and is arranged on the downstream side of print inspection device 3 along the conveyance direction of board S as illustrated in FIG. 1. Each component mounter 5 includes a housing, a feeder setting base on which multiple feeders 50 are mounted, a board conveyance device, an XY moving device, a mounting head including at least one suction nozzle, a part camera, a mark camera, a nozzle station, a mounting control section, and the like (none illustrated). The mounting control section of each component mounter 5 is a computer including CPU, ROM, RAM, a storage device, and the like, and mutually exchanges information with production management device 10 via wireless or wired communication. In addition, the mounting control section acquires captured image data of the part camera and the mark camera, detected values of various sensors (not illustrated) installed in the board conveyance device, the XY moving device, the mounting head, and the like. The mounting control section controls multiple feeders 50, the XY moving device, the mounting head, and the like based on the information from production management device 10, the captured image data of the part camera and the mark camera, the detected values of various sensors, and the like.

Mounting inspection device 6 is for inspecting the mounting state of component P mounted by each component mounter 5, and includes an inspection mechanism, a control device (computer) for controlling the inspection mechanism, and the like. The control device of mounting inspection device 6 also mutually exchanges information with production management device 10 via wireless or wired communication. Reflow device 7 is disposed on the downstream side of mounting inspection device 6, and includes a board conveyance device for conveying board S from mounting inspection device 6, a heating section for heating board S conveyed by the board conveyance device, and a reflow control section for controlling the board conveyance device, the heating section, and the like. Reflow device 7 heats board S to a predetermined reflow temperature (for example, 220° C. to 250° C.) by the heating section to melt the solder on board S. As a result, the molten solder is cooled and solidified, so that each component is electrically connected to and fixed to the wiring pattern of board S. Reflow inspection device 8 is for inspecting the state of component P on board S on which a reflow process is performed, and includes an inspection mechanism, a control device for controlling the inspection mechanism, and the like. The control devices of reflow device 7 and reflow inspection device 8 are computers including CPU, ROM, RAM, a storage device, and the like, and mutually exchange information with production management device 10 via wireless or wired communication, respectively.

In the present embodiment, production management device 10 includes CPU, ROM, RAM, a storage device, and the like, and is a computer to which an input device such as a keyboard and a mouse, and a display are connected. The storage device of production management device 10 stores a production program of board S, production information related to the production of board S, and the like. The production program defines the mounting order of components P with respect to board S in multiple component mounters 5 of production line 1, the production number of boards S, and the like. In addition, the production information includes a production plan, an operation situation of a device constituting production line 1, printing information indicating a printing position of solder on board S, component information on component P to be mounted on board S, a target mounting position (XY coordinates) of each component P on board S, nozzle information on a suction nozzle to be mounted on the mounting head, and the like. When producing board 5, production management device 10 executes the production program using the production information or the like, and provides various command signals or the like to a printing control section of printing device 2, the mounting control section of each component mounter 5, the reflow control section of reflow device 7, and the like.

Figure 4:
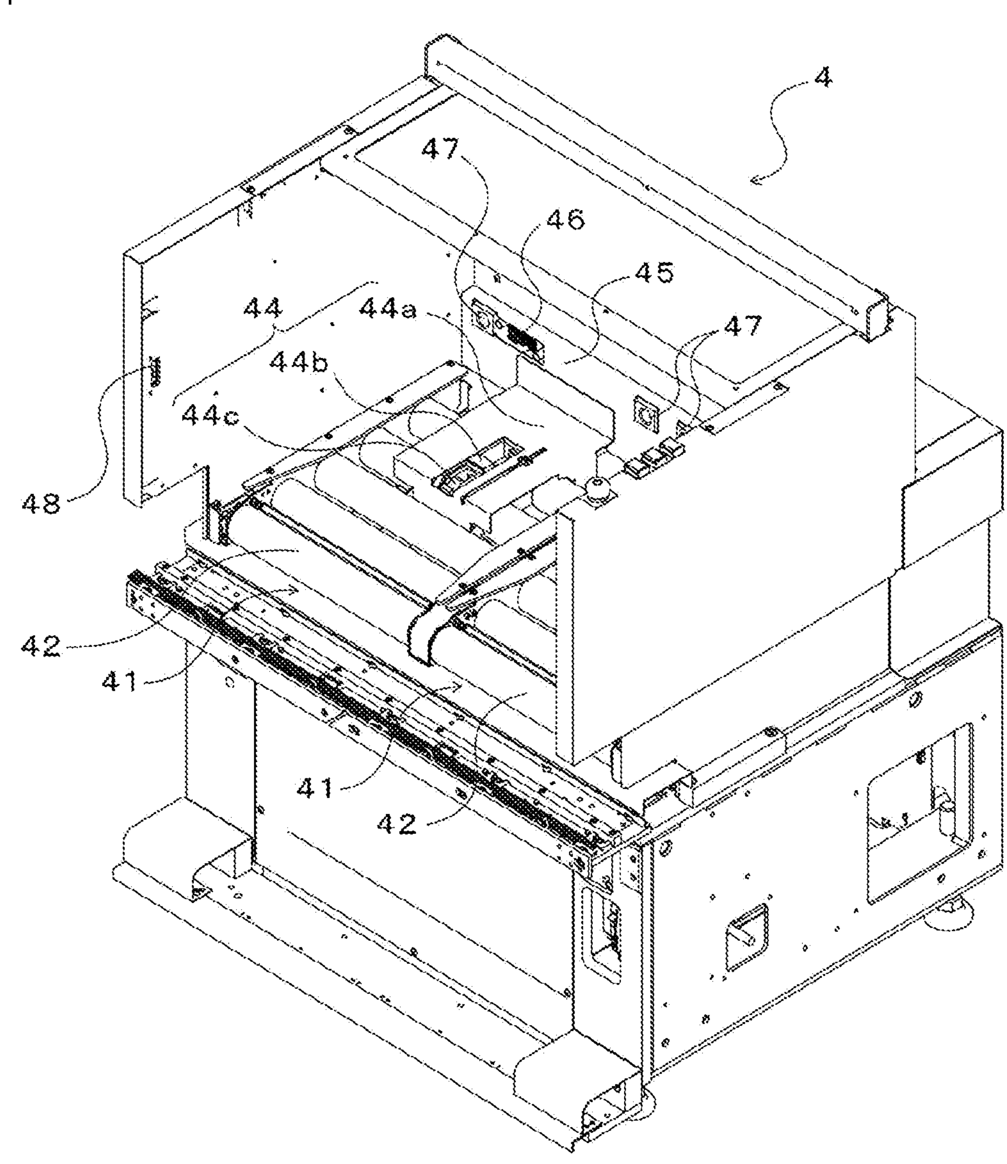
FIG. 4 is a perspective view illustrating a storage section included in the production line of FIG. 1.
Figure 5:
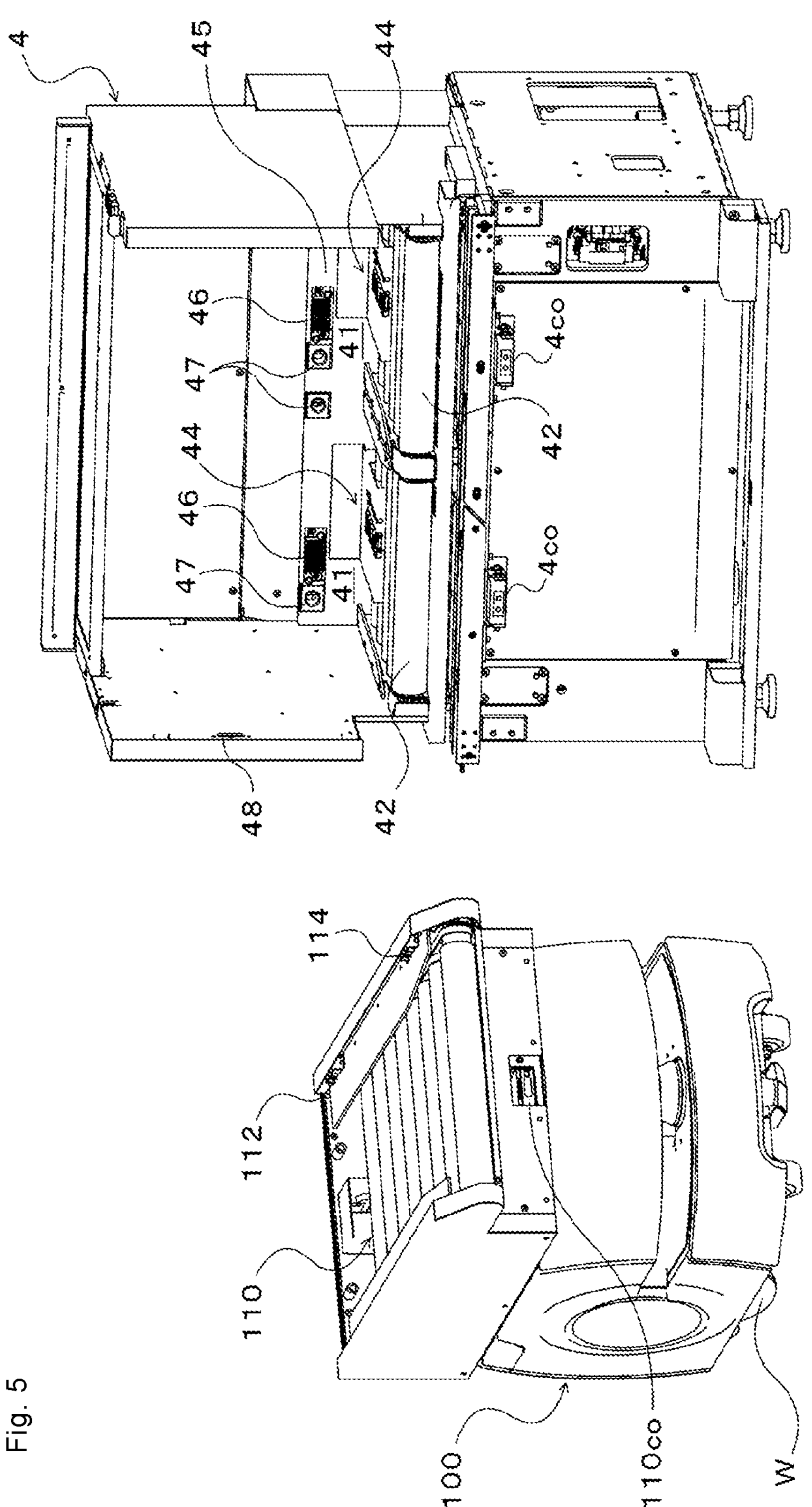
FIG. 5 is a perspective view illustrating an automated guided vehicle and the storage section constituting the article delivery system of the present disclosure.
Figure 6:
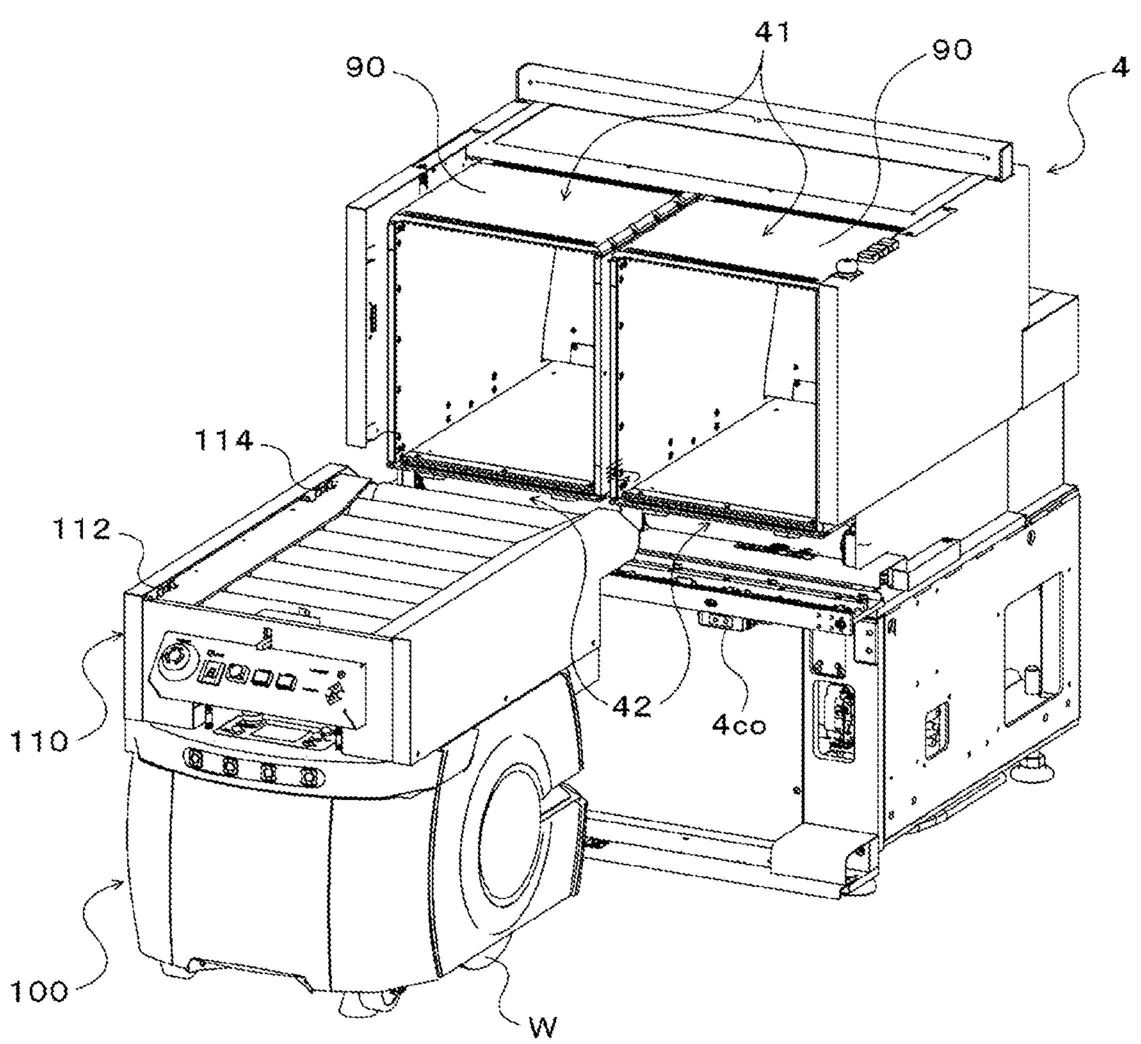
FIG. 6 is a perspective view illustrating the automated guided vehicle and the storage section constituting the article delivery system of the present disclosure.
Figure 7:
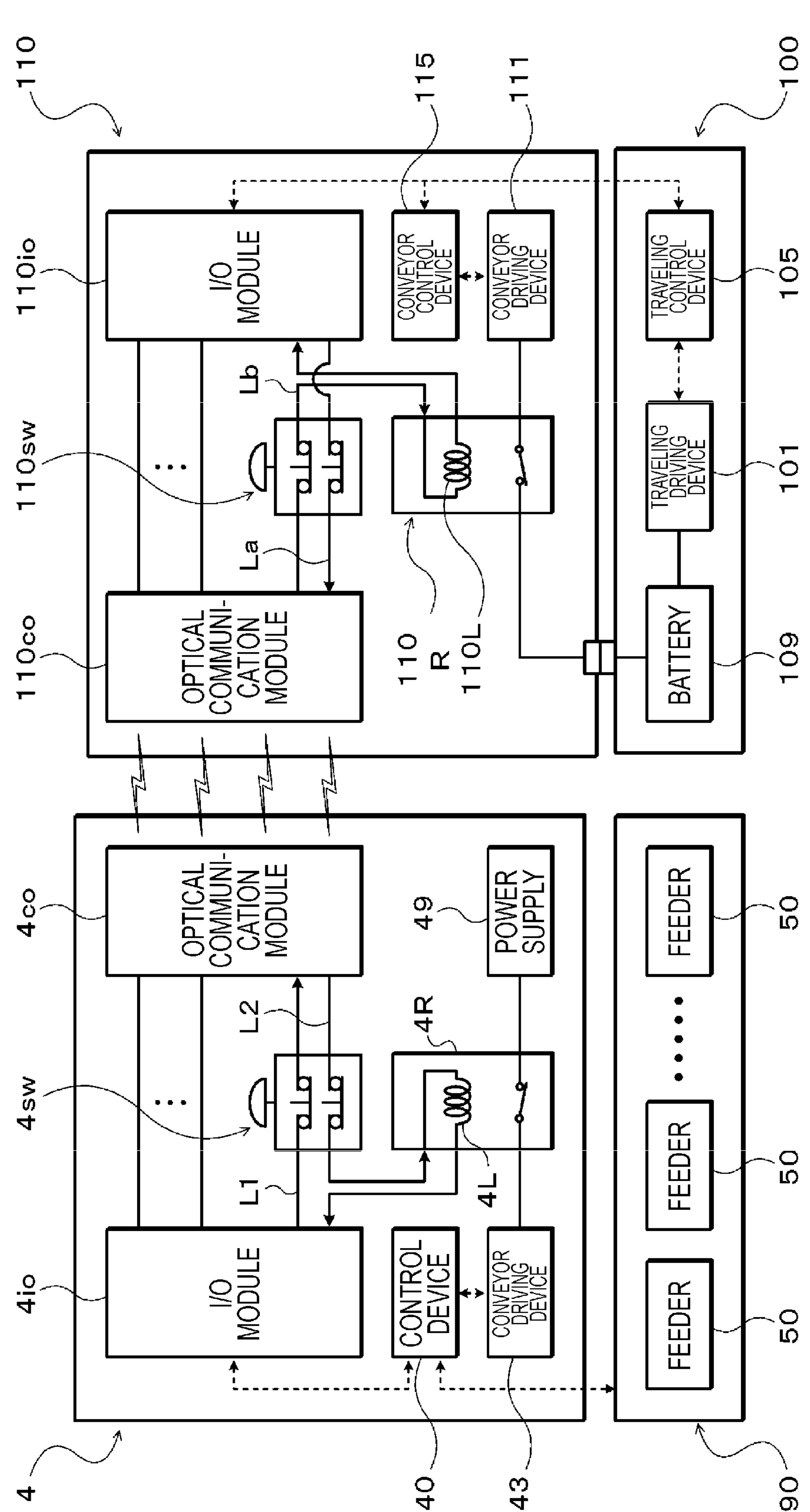
FIG. 7 is a block diagram illustrating the article delivery system of the present disclosure.

FIG. 4 is a perspective view illustrating storage section 4 of production line 1, FIGS. 5 and 6 are perspective views illustrating storage section 4 and automated guided vehicle 100, and FIG. 7 is a control block diagram of the article delivery system including storage section 4 and automated guided vehicle 100.

As illustrated in FIGS. 4 to 6, electric conveyor (second electric conveyor) 42 in each storage space 41 of storage section 4 is a roller conveyor including conveyor driving device 43 (refer to FIG. 7) and clamp mechanism 44 for clamping clamped member 91 of accommodation case 90. However, electric conveyor 42 may be another conveyance device such as a belt conveyor. Electric conveyor 42 is installed in corresponding storage space 41 so as to face wall section 45 installed in storage section 4 so as to straddle two storage spaces 41. Conveyor driving device 43 of electric conveyor 42 includes an electric motor, a drive circuit of the electric motor controlled by control device 40, and the like, and is connected to power supply 49 via conveyor power relay (second relay) 4R (refer to FIG. 7). Conveyor power relay 4R is a mechanical relay including coil 4L, a movable contact, a fixed contact, and the like.

Clamp mechanism 44 includes flat supporting plate 44*a*, moving member 44*b*, and claw member 44*c* that are disposed on a mounting surface of electric conveyor 42. Moving member 44*b* is supported so as to be movable along the conveyance direction of electric conveyor 42 by a guide member fixed to the rear surface of supporting plate 44*a*, and is moved by a driving unit (not illustrated) such as an air cylinder controlled by control device 40. In addition, moving member 44*b* includes an abutting section that can abut on a first end part (end part on connector 93 side) of clamped member 91 of accommodation case 90, and the abutting section is exposed from an opening portion formed in supporting plate 44*a*.

Claw member 44*c* is supported by moving member 44*b* so as to be pivotable about a rotational axis orthogonal to the conveyance direction of electric conveyor 42, and is exposed from the opening portion formed in supporting plate 44*a*. As moving member 44*b* is moved to the side of wall section 45 by the driving unit, claw member 44*c* is guided by the guide member and pivoted with respect to moving member 44*b* so as to abut on a second end part (end part on the side opposite to a connector 93 side) of clamped member 91 of accommodation case 90. In addition, as moving member 44*b* is moved by the driving unit so as to be separated from wall section 45, claw member 44*c* is guided by the guide member and pivoted with respect to moving member 44*b* so as to be separated from the second end part (end part on the side opposite to the connector 93 side) of clamped member 91 of accommodation case 90.

Furthermore, clamp mechanism 44 includes a first sensor for detecting detected member 92 (protruding portion) of accommodation case 90 entering the slit formed in supporting plate 44*a*, a second sensor for detecting that clamped member 91 of accommodation case 90 is clamped, and a third sensor for detecting that the clamp of clamped member 91 is released (none illustrated). The first sensor is, for example, a light shielding sensor, and transmits to control device 40 indicating that detected member 92 is sensed. The second and third sensors are position sensors for detecting a position of moving member 44*b* (rod of the driving unit), and transmit a signal indicating that clamped member 91 is clamped or a signal indicating that the clamp of clamped member 91 is released to control device 40.

In addition, connector 46 and two first case detection sensors 47 are disposed on wall section 45 of storage section 4. As described above, connector 46 can be coupled to an external connector of accommodation case 90. Both two first case detection sensors 47 are proximity sensors and are disposed on wall section 45 at intervals so as to be able to abut on an end part of accommodation case 90, respectively. Each first case detection sensor 47 transmits a signal indicating that accommodation case 90 approaches wall section 45 to control device 40. In addition, second case detection sensor 58 for detecting the entrance or exit of accommodation case 90 with respect to electric conveyor 42 is installed in each storage space 41. Each second case detection sensor 58 is, for example, a light shielding sensor, and transmits a signal indicating the fact to control device 40 while accommodation case 90 passes through.

Furthermore, each storage space 41 of storage section 4 includes input/output (I/O) module (second signal generation section) 4*io* connected to control device 40 and various devices, optical communication module (second communication module) 4*co* connected to input/output module 4*io*, and emergency stop switch (second emergency stop switch) 4*sw* disposed at a position that can be easily accessed by an operator. Input/output module 4*io* includes a microcomputer or the like for controlling communication with an input section, an output section, control device 40, or the like, or communication between the input section and the output section. Optical communication module 4*co* includes a bidirectional photoelectric conversion device that converts an electric signal (current signal) into an optical signal such as infrared light, for example, and converts an optical signal into an electric signal (current signal), and is connected to input/output module 4*io* via multiple communication lines including first and second lines L1 and L2. Optical communication module 4*co* may have directivity or may not have directivity.

In the present embodiment, input/output module 4*io* normally outputs an electric signal (current signal) to first line L1 in response to a command from control device 40 while accommodation case 90 can be delivered between electric conveyor 42 of storage section 4 (storage space 41) and automated guided vehicle 100. In addition, optical communication module 4*co* converts the electric signal from first line L1 into an optical signal, and outputs the optical signal (second signal) from a light emitting section as a preparation completion signal indicating that the preparation for delivery of accommodation case 90 is completed. Furthermore, optical communication module 4*co* converts a predetermined optical signal (first signal) received by a light receiving section into an electric signal (current signal), and outputs the electric signal to second line L2. Coil 4L of conveyor power relay 4R is incorporated in second line L2, and an electric signal output from optical communication module 4*co* to second line L2 is transmitted to input/output module 4*io* via coil 4L.

Emergency stop switch 4*sw* is a normally closed push button switch that is opened when pressed, and is operated (pressed) by the operator when any abnormality or the like occurs during the delivery of accommodation case 90 between electric conveyor 42 and automated guided vehicle 100. As illustrated in FIG. 7, emergency stop switch 4*sw* is incorporated in first and second lines L1 and L2, and allows communication (transmission) between input/output module 4*io* and optical communication module 4*co* via first and second lines L1 and L2 when the button is not pressed. When the button of emergency stop switch 4*sw* is not pressed in this manner, the electric signal (current signal) output from optical communication module 4*co* to second line L2 is applied to coil 4L of conveyor power relay 4R as an excitation current, and the movable contact of conveyor power relay 4R is brought into contact with the fixed contact. As a result, when the button of emergency stop switch 4*sw* is not pressed, conveyor power relay 4R is closed (on), electric power is supplied from power supply 49 to conveyor driving device 43, and electric conveyor 42 can be operated.

In addition, emergency stop switch 4*sw* shuts off communication (transmission) between input/output module 4*io* and optical communication module 4*co* via first line L1 when the button is pressed, and shuts off communication (energization) between optical communication module 4*co* and input/output module 4*io* via second line L2 between optical communication module 4*co* and conveyor power relay 4R (coil 4L). When the button of emergency stop switch 4*sw* is pressed in this manner, the electric signal (current signal) output from optical communication module 4*co* to second line L2 is not supplied to coil 4L of conveyor power relay 4R, and conveyor power relay 4R is opened (off).

Automated guided vehicle 100 conveys accommodation case 90 accommodating multiple unused or used feeders 50 between an outer setup area (not illustrated) in which a large number of feeders 50 are stored and storage section 4 of production line 1. As illustrated in FIG. 7, automated guided vehicle 100 is a general-purpose conveyance vehicle including traveling driving device 101 that drives drive wheel W (refer to FIGS. 5 and 6), and traveling control device 105 that controls traveling driving device 101 based on detected values of a position sensor, an obstacle monitoring sensor, or the like (not illustrated). Traveling driving device 101 of automated guided vehicle 100 includes an electric machine driven by electric power from battery 109 serving as a power supply, a drive circuit of the electric machine controlled by traveling control device 105, a steering mechanism (not illustrated), and the like. Traveling control device 105 is a computer including CPU, ROM, RAM, a storage device, and the like. Electric conveyor (first electric conveyor) 110 for delivering accommodation case 90 as an article to and from electric conveyor 42 installed in each storage space 41 of storage section 4 is mounted on automated guided vehicle 100. Electric conveyor 110 is fixed to a mounting portion of automated guided vehicle 100 so as to be able to face electric conveyor 42 installed in each storage space 41 of storage section 4.

As illustrated in FIGS. 5 and 6, electric conveyor 110 is a roller conveyor manufactured separately from automated guided vehicle 100, and is configured as one unit including conveyor driving device 111 and conveyor control device 115 for controlling conveyor driving device 111. In this manner, by mounting electric conveyor 110, which is a unit separate from automated guided vehicle 100, on automated guided vehicle 100, general-purpose automated guided vehicle 100 or existing automated guided vehicle 100 can be used, so that it is possible to suppress an increase in the cost of the article delivery system. Conveyor driving device 111 of electric conveyor 110 includes an electric machine, a drive circuit of the electric machine controlled by conveyor control device 115, and the like, and is connected to battery (power supply) 109 of automated guided vehicle 100 via conveyor power relay (first relay) 110R, a connector, and a cable (not illustrated), and the like (refer to FIG. 7). Conveyor power relay 110R is a mechanical relay including coil 110L, a movable contact, a fixed contact, and the like. In addition, conveyor control device 115 is a computer including CPU, ROM, RAM, a storage device, and the like, and is connected to traveling control device 105 of automated guided vehicle 100 via an input/output module (not illustrated) or the like so as to exchange information with each other by wireless or wired communication. However, electric conveyor 110 may be another conveyance device such as a belt conveyor, or may include a dedicated battery (power supply) separate from battery 109 of automated guided vehicle 100.

Furthermore, as illustrated in FIGS. 5 and 6, electric conveyor 110 includes first case detection sensor 112 for detecting the presence or absence of accommodation case 90, and second case detection sensor 114 for detecting the entrance or exit of accommodation case 90 with respect to electric conveyor 110. First case detection sensor 112 is, for example, a light shielding sensor disposed at a rear end part of electric conveyor 110 (end part on the side distant from electric conveyor 42), and transmits a signal indicating that accommodation case 90 is present to conveyor control device 115. Second case detection sensor 114 is, for example, a light shielding sensor disposed at a front end part of electric conveyor 110 (end part on the side closer to electric conveyor 42), and transmits a signal indicating the fact to conveyor control device 115 while accommodation case 90 passes through.

In addition, electric conveyor 110 includes input/output (I/O) module (first signal generation section) 110*io* connected to conveyor control device 115 and traveling control device 105 of automated guided vehicle 100, optical communication module (first communication module) 110*co* connected to input/output module 110*io* via multiple signal lines and capable of exchanging optical signals with optical communication module 4*co* in each storage space 41 of storage section 4, and emergency stop switch (first emergency stop switch) 110*sw* disposed at a position that can be easily accessed by the operator. Input/output module 110*io* includes a microcomputer or the like that controls communication with an input section, an output section, conveyor control device 115 or the like, or communication between the input section and the output section. Optical communication module 110*co* includes a bidirectional photoelectric conversion device that converts an electric signal (current signal) into an optical signal such as infrared light and converts an optical signal into an electric signal (current signal), and is connected to input/output module 110*io* via multiple communication lines including first and second lines La and Lb. Optical communication module 110*co* may also have directivity or may not have directivity as long as optical communication module 110*co* can exchange optical signals with optical communication module 4*co* of each storage space 41.

In the present embodiment, input/output module 110*io* normally outputs an electric signal (current signal) to first line La in response to a command from conveyor control device 115 while accommodation case 90 can be delivered between electric conveyor 42 on storage section 4 (storage space 41) side and electric conveyor 110 on automated guided vehicle 100 side. In addition, optical communication module 110*co* converts the electric signal from first line La into an optical signal, and outputs the optical signal (first signal) from a light emitting section to optical communication module 4*co* on storage section 4 side as an arrival signal indicating that it approaches storage section 4. Furthermore, optical communication module 110*co* converts the optical signal (second signal, that is, preparation completion signal) from optical communication module 4*co* on storage section 4 side received by a light receiving section into an electric signal (current signal), and outputs the electric signal to second line Lb. Coil 110L of conveyor power relay 110R is incorporated in second line Lb, and the electric signal output from optical communication module 110*co* to second line Lb is transmitted to input/output module 110*io* via coil 110L.

Emergency stop switch 110*sw* is also a normally closed push button switch that is opened when pressed, and is operated (pressed) by the operator when any abnormality or the like occurs during the delivery of accommodation case 90 between electric conveyor 110 and electric conveyor 42 on storage section 4 side. As illustrated in FIG. 7, emergency stop switch 110*sw* allows communication (transmission) between input/output module 110*io* and optical communication module 110*co* via first and second lines La and Lb when the button is not pressed. When the button of emergency stop switch 110*sw* is not pressed in this manner, the electric signal (current signal) output from optical communication module 110*co* to second line Lb is applied to coil 110L of conveyor power relay 110R as an excitation current, and the movable contact of conveyor power relay 110R is brought into contact with the fixed contact. As a result, when the button of emergency stop switch 110*sw* is not pressed, conveyor power relay 110R is closed (on) to supply electric power from battery 109 to conveyor driving device 111, and electric conveyor 110 can be operated.

In addition, emergency stop switch 110*sw* shuts off communication (transmission) between input/output module 110*io* and optical communication module 110*co* via first line La when the button is pressed, and shuts off communication between optical communication module 110*co* and input/output module 110*io* via second line Lb between optical communication module 110*co* and conveyor power relay 110R (coil 110L). When the button of emergency stop switch 110*sw* is pressed in this manner, the electric signal (current signal) output from optical communication module 110*co* to second line Lb is not supplied to coil 110L of conveyor power relay 110R, and conveyor power relay 110R is opened (off).

Next, a procedure for delivering accommodation case 90 accommodating multiple feeders 50 between electric conveyor 110 on automated guided vehicle 100 side and electric conveyor 42 of storage section 4 (storage space 41) will be described.

In a case where accommodation case 90 accommodating multiple unused feeders 50 is conveyed by automated guided vehicle 100 to storage section 4 and delivered to corresponding storage space 41, accommodation case 90 is placed on electric conveyor 110 mounted on automated guided vehicle 100 in the outer setup area. In addition, traveling control device 105 of automated guided vehicle 100 sets storage space 41 of storage section 4 designated by the management device or the like of the outer setup area to the target position. Furthermore, traveling control device 105 controls traveling driving device 101 so that automated guided vehicle 100 travels to storage space 41 which is the target position along a predetermined traveling route.

After the traveling of automated guided vehicle 100 is started, traveling control device 105 instructs input/output module 110*io* of electric conveyor 110 to output an electric signal (current signal) to first line La. Optical communication module 110*co* of electric conveyor 110 (automated guided vehicle 100 side) converts the electric signal from first line La into an optical signal (first signal), and outputs the optical signal from the light emitting section as an arrival signal. In addition, control device 40 of storage section 4 instructs input/output module 4*io* of storage space 41 which is a conveyance destination of accommodation case 90 to output an electric signal to first line L1 on the condition that accommodation case 90 can be delivered. Optical communication module 4*co* of storage space 41 converts the electric signal from first line L1 into an optical signal (second signal), and outputs the optical signal from the light emitting section as a preparation completion signal.

When automated guided vehicle 100 approaches storage space 41 which is the target position, optical communication module 4*co* of storage space 41 and optical communication module 110*co* of electric conveyor 110 can communicate with each other. When optical communication module 4*co* of storage space 41 receives (receives light of) an arrival signal (optical signal) from optical communication module 110*co* of electric conveyor 110, optical communication module 4*co* converts the arrival signal into an electric signal and outputs the electric signal to second line L2. The electric signal (current signal) output to second line L2 is supplied to input/output module 4*io* of storage space 41 via coil 4L of conveyor power relay 4R. As a result, coil 4L of conveyor power relay 4R is excited, and conveyor power relay 4R is closed (on) so as to allow power supply to electric conveyor 42 (conveyor driving device 43).

In addition, when optical communication module 110*co* of electric conveyor 110 receives (receives light of) the preparation completion signal (optical signal) from optical communication module 4*co* of storage space 41, optical communication module 110*co* converts the preparation completion signal into an electric signal and outputs the electric signal to second line Lb. The electric signal (current signal) output to second line Lb is supplied to input/output module 110*io* on automated guided vehicle 100 side via coil 110L of conveyor power relay 110R. As a result, coil 110L of conveyor power relay 110R is excited, and conveyor power relay 110R is closed (on) so as to allow power supply to electric conveyor 110 (conveyor driving device 111).

Furthermore, when the electric signal supplied from second line Lb to input/output module 110*io* in response to the reception (light reception) of the preparation completion signal is brought to a high level, traveling control device 105 of automated guided vehicle 100 stops automated guided vehicle 100 so that electric conveyor 110 faces electric conveyor 42 in storage space 41 based on the detected value of the position sensor or the monitoring sensor. After automated guided vehicle 100 stops, conveyor control device 115 of electric conveyor 110 controls conveyor driving device 111 so that electric conveyor 110 feeds accommodation case 90 to electric conveyor 42 side. As a result, conveyor driving device 111 is driven by electric power from battery 109 supplied via conveyor power relay 110R, and accommodation case 90 is fed to electric conveyor 42 side by electric conveyor 110. In addition, control device 40 of storage section 4 controls conveyor driving device 43 so that electric conveyor 42 of corresponding storage space 41 receives accommodation case 90 from electric conveyor 110. As a result, conveyor driving device 43 is driven by electric power from power supply 49 supplied via conveyor power relay 4R, and accommodation case 90 is transferred from electric conveyor 110 to electric conveyor 42.

When accommodation case 90 is transferred to electric conveyor 42, the first end part of clamped member 91 of accommodation case 90 abuts on moving member 44*b*. In addition, control device 40 of storage section 4 operates the driving unit of moving member 44*b* so as to pull moving member 44*b* toward wall section 45 based on a signal or the like from the first sensor of clamp mechanism 44. As moving member 44*b* moves toward wall section 45 side, claw member 44*c* pivots with respect to moving member 44*b* so as to abut on the second end part of clamped member 91. As a result, clamped member 91 is clamped by clamp mechanism 44, and accommodation case 90 is pulled toward wall section 45 by the driving unit of clamp mechanism 44. When moving member 44*b* further moves toward wall section 45, accommodation case 90 is pulled up on supporting plate 44*a*, and the external connector of accommodation case 90 is coupled to connector 46 of storage space 41. As a result, the delivery of accommodation case 90 from automated guided vehicle 100 to storage space 41 is completed, and multiple feeders 50 in accommodation case 90 and control device 40 can communicate with each other. After the delivery of accommodation case 90 is completed, control device 40 of storage section 4 stops corresponding electric conveyor 42, and conveyor control device 115 on automated guided vehicle 100 side stops electric conveyor 110.

Meanwhile, in a case where accommodation case 90 accommodating multiple used feeders 50 is delivered from corresponding storage space 41 to automated guided vehicle 100, automated guided vehicle 100 in which accommodation case 90 is not mounted on electric conveyor 110 starts traveling from the outer setup area toward storage space 41 that is the target position. Also, in this case, traveling control device 105 of automated guided vehicle 100 instructs input/output module 110*io* of electric conveyor 110 to output an electric signal (current signal) to first line La. Optical communication module 110*co* of electric conveyor 110 (automated guided vehicle 100 side) converts the electric signal from first line La into an optical signal (first signal), and outputs the optical signal from the light emitting section as an arrival signal. In addition, control device 40 of storage section 4 instructs input/output module 4*io* of corresponding storage space 41 to output an electric signal to first line L1 on the condition that clamped member 91 of accommodation case 90 accommodating at least multiple used feeders 50 is clamped by clamp mechanism 44. Optical communication module 4*co* of storage space 41 converts the electric signal from first line L1 into an optical signal (second signal), and outputs the optical signal from the light emitting section as a preparation completion signal.

When optical communication module 4*co* of storage space 41 and optical communication module 110*co* of electric conveyor 110 can communicate with each other in response to the approaching of automated guided vehicle 100 to storage space 41, as described above, the electric signal output from optical communication module 4*co* of storage space 41 to second line L2 is supplied to input/output module 4*io* of storage space 41 via coil 4L of conveyor power relay 4R. As a result, conveyor power relay 4R is closed (on) so as to allow power supply to electric conveyor 42 (conveyor driving device 43). In addition, the electric signal output from optical communication module 110*co* of electric conveyor 110 to second line Lb is supplied to input/output module 110*io* on automated guided vehicle 100 side via coil 110L of conveyor power relay 1108. As a result, conveyor power relay 110R is closed (on) so as to allow power supply to electric conveyor 110 (conveyor driving device 111).

When automated guided vehicle 100 stops and electric conveyor 110 faces electric conveyor 42 in storage space 41, control device 40 of storage section 4 controls conveyor driving device 43 so that electric conveyor 42 feeds accommodation case 90 to electric conveyor 110 side. As a result, conveyor driving device 43 is driven by the electric power from power supply 49 supplied via conveyor power relay 4R, and accommodation case 90 accommodating used feeder 50 is fed to electric conveyor 110 side by electric conveyor 42. In addition, conveyor control device 115 of electric conveyor 110 controls conveyor driving device 111 so that electric conveyor 110 receives accommodation case 90 from electric conveyor 42. As a result, conveyor driving device 111 is driven by the electric power from battery 109 supplied via conveyor power relay 110R, and the operation of electric conveyor 110 is started.

After the operation of electric conveyors 42 and 110 is started, control device 40 of storage section 4 operates the driving unit of moving member 44*b* of clamp mechanism 44 so as to separate moving member 44*b* from wall section 45. As moving member 44*b* is separated from wall section 45, accommodation case 90 is pushed toward electric conveyor 110 side by moving member 44*b* via clamped member 91, and claw member 44*c* pivots with respect to moving member 44*b* so as to be separated from the second end part of clamped member 91. As a result, the clamp of clamped member 91 by clamp mechanism 44 is released, accommodation case 90 is delivered from supporting plate 44*a* to electric conveyor 42, and is transferred from electric conveyor 42 to electric conveyor 110. When conveyor control device 115 of electric conveyor 110 determines that accommodation case 90 reaches a predetermined position on electric conveyor 110 based on the detected values of first and second case detection sensors 112 and 114, electric conveyor 110 is stopped, and in response to the fact, control device 40 of storage section 4 also stops corresponding electric conveyor 42. As a result, the delivery of accommodation case 90 from storage space 41 to automated guided vehicle 100 is completed.

As described above, while accommodation case 90 is delivered between electric conveyor 42 of storage space 41 and electric conveyor 110 on automated guided vehicle 100 side, the preparation completion signal and the arrival signal are transmitted and received between optical communication modules 4*co* and 110*co*, so that conveyor power relays 4R and 110R are closed to enable electric conveyors 42 and 110 to operate. In addition, in production line 1, when the operator detects any abnormality or the like during the delivery of accommodation case 90 between storage space 41 and automated guided vehicle 100, the delivery of accommodation case 90 can be stopped by pressing the button of emergency stop switch 4*sw* of storage space 41 or emergency stop switch 110*sw* of electric conveyor 110 (automated guided vehicle 100 side).

Figure 8:
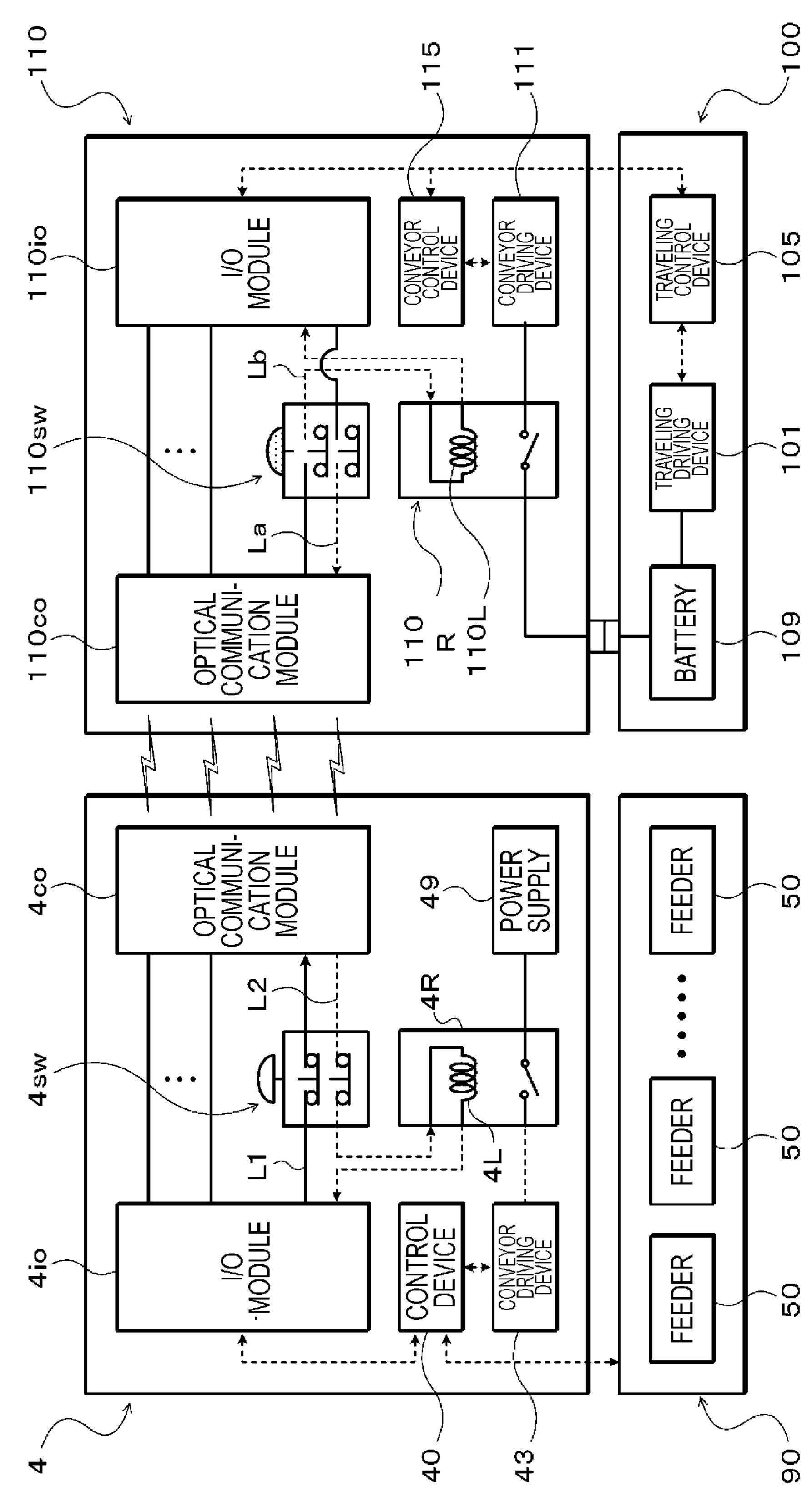
FIG. 8 is a block diagram illustrating a state of the article delivery system of the present disclosure when an emergency stop switch on the side of the automated guided vehicle is operated.

That is, in a case where the operator presses the button of emergency stop switch 110*sw* of electric conveyor 110, as illustrated in FIG. 8, in response to the operation, that is, opening of emergency stop switch 110*sw*, the electric signal (current signal) output from optical communication module 110*co* of electric conveyor 110 to second line Lb is not supplied to coil 110L of conveyor power relay 110R (refer to dashed lines in FIG. 8). As a result, conveyor power relay 110R is opened (off) in response to the pressing of the button of emergency stop switch 110*sw*, and the power supply from battery 109 to conveyor driving device 111 (electric conveyor 110) is shut off.

In addition, in response to the operation, that is, opening of emergency stop switch 110*sw*, the transmission of the electric signal from input/output module 110*io* of electric conveyor 110 to optical communication module 110*co* via first line La is shut off, and the arrival signal (optical signal) is not output from optical communication module 110*co*. As a result, the electric signal (current signal) output from optical communication module 4*co* on storage section 4 side to second line L2 changes from the high level to a low level (0 V), and the electric signal (current signal) is not supplied to coil 4L of conveyor power relay 4R (refer to the dashed lines in FIG. 8). As a result, conveyor power relay 4R is opened (off) in response to the pressing of the button of emergency stop switch 110*sw*, and the power supply from power supply 49 to conveyor driving device 43 (electric conveyor 42) is shut off.

Figure 9:
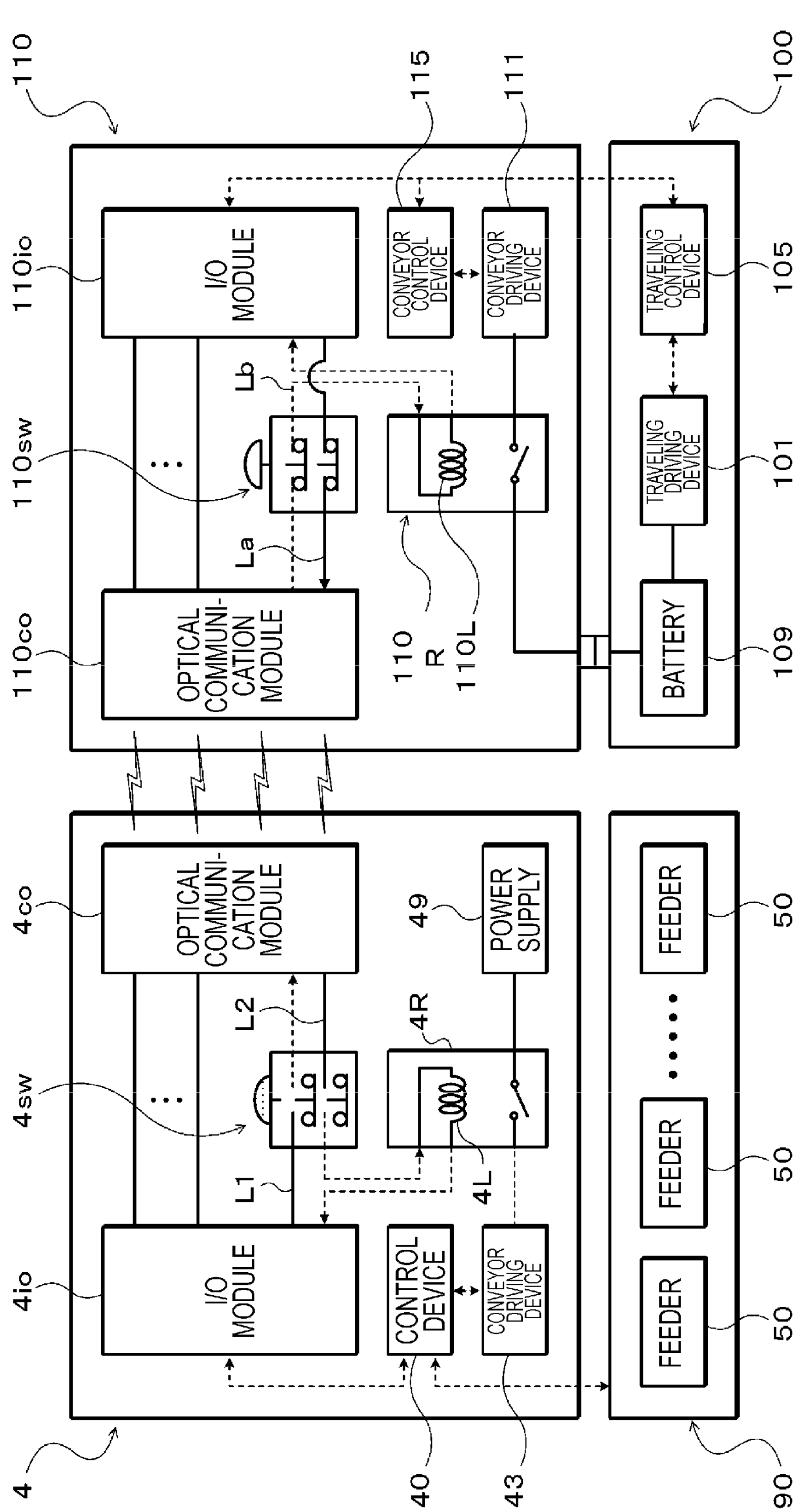
FIG. 9 is a block diagram illustrating a state of the article delivery system of the present disclosure when an emergency stop switch on the side of the storage section is operated.

Furthermore, in a case where the operator presses the button of emergency stop switch 4*sw* on storage section 4 side, as illustrated in FIG. 9, in response to the operation, that is, opening of emergency stop switch 4*sw*, the electric signal (current signal) output from optical communication module 4*co* of storage space 41 to second line L2 is supplied to neither coil 4L of conveyor power relay 4R (nor input/output module 4*io*) (refer to dashed lines in FIG. 9). As a result, conveyor power relay 4R is opened (off) in response to the pressing of the button of emergency stop switch 4*sw*, and the power supply from power supply 49 to conveyor driving device 43 (electric conveyor 42) is shut off.

In addition, in response to the operation, that is, opening of emergency stop switch 4*sw*, the transmission of the electric signal from input/output module 4*io* of storage space 41 to optical communication module 4*co* via first line L1 is shut off, and the arrival signal (optical signal) is not output from optical communication module 4*co*. As a result, the electric signal (current signal) output from optical communication module 110*co* of electric conveyor 110 to second line Lb changes from the high level to the low level (0 V), and the electric signal (current signal) is not supplied to coil 110L of conveyor power relay 110R (refer to the dashed line in FIG. 9). As a result, conveyor power relay 110R is opened (off) in response to the pressing of the button of emergency stop switch 4*sw*, and the power supply from battery 109 to conveyor driving device 111 (electric conveyor 110) is shut off.

As described above, in production line 1, both electric conveyor 110 on automated guided vehicle 100 side and electric conveyor 42 of corresponding storage space 41 can be stopped in response to the opening of any one of emergency stop switch 110*sw* of electric conveyor 110 (automated guided vehicle 100 side) and emergency stop switch 4*sw* of each storage space 41. Therefore, it is possible to satisfactorily suppress the unexpected movement of accommodation case 90 during the emergency stop, and to further improve the safety of the delivery work of accommodation case 90 between automated guided vehicle 100 and storage space 41 (storage section 4).

Furthermore, by stopping both electric conveyors 42 and 110 delivered accommodation case 90 in response to the opening (operation) of any one of emergency stop switches 4*sw* and 110*sw*, it is possible to continuously operate any device of automated guided vehicle 100 and storage section 4 while securing safety, and the recovery efficiency after the emergency stop can be improved. That is, in the present embodiment, even when the power supply to electric conveyors 42 and 110 is continued in response to the opening of any one of emergency stop switches 4*sw* and 110*sw*, the power supply from a low-voltage power supply (not illustrated) to control device 40 of storage section 4 and conveyor control device 115 of electric conveyor 110 (automated guided vehicle 100 side) is continued. As a result, even after both electric conveyors 42 and 110 are stopped in response to the opening of any one of emergency stop switches 4*sw* and 110*sw*, the communication between control device 40 of storage section 4 and conveyor control device 115 on automated guided vehicle 100 side can be continued via optical communication modules 4*co* and 110*co*. As a result, even in a case where multiple automated guided vehicles 100 are used during the production of board S, since automated guided vehicle 100, which is a target of the emergency stop, can be easily specified, it is possible to further improve the recovery efficiency after the emergency stop.

In addition, in the present embodiment, when any one of emergency stop switches 4*sw* and 110*sw* is opened, the fact is notified from input/output module 110*io* to traveling control device 105 of automated guided vehicle 100, and traveling control device 105 opens a relay (not illustrated) installed between traveling driving device 101 and battery 109 to shut off the power supply to traveling driving device 101. As a result, it is possible to further improve the safety when both electric conveyors 42 and 110 that deliver accommodation case 90 are stopped in response to the opening of any one of emergency stop switches 4*sw* and 110*sw*.

Furthermore, electric conveyor 110 mounted on automated guided vehicle 100 includes input/output module 110*io* serving as a first signal generation section for transmitting an electric signal to optical communication module 110*co*, and conveyor power relay (first relay) 110R for shutting off the power supply to conveyor driving device 111 (electric conveyor 110) in response to the shut-off of communication between input/output module 110*io* and optical communication module 110*co* by emergency stop switch 110*sw*. In addition, storage section 4 includes input/output module 4*io* serving as a second signal generation section for transmitting an electric signal to optical communication module 4*co*, and conveyor power relay (second relay) 4R for shutting off the power supply to conveyor driving device 43 (electric conveyor 42) in response to the shut-off of communication between input/output module 4*io* and optical communication module 4*co* by emergency stop switch 4*sw*. Furthermore, optical communication module 110*co* of electric conveyor 110 (automated guided vehicle 100 side) transmits an arrival signal (first signal) based on the electric signal from input/output module 110*io* to optical communication module 4*co*, and when a preparation completion signal (second signal) from optical communication module 4*co* changes from the high level to the low level in response to the shut-off of the communication between input/output module 4*io* and optical communication module 110*co* by emergency stop switch 4*sw* on storage section 4 side, the electric signal (current signal) to second line Lb is changed to the low level (0 V) to cause conveyor power relay 110R to shut off the power supply to conveyor driving device 111 (electric conveyor 110). In addition, optical communication module 4*co* on storage section 4 side transmits the preparation completion signal (second signal) based on the electric signal from input/output module 4*io* to optical communication module 4*co*, and when the arrival signal (first signal) from optical communication module 110*co* changes from the high level to the low level in response to the shut-off of the communication between input/output module 110*io* and optical communication module 110*co* by emergency stop switch 110*sw* of electric conveyor 110, the electric signal (current signal) to second line L2 is changed to the low level (0 V) to cause conveyor power relay 4R to shut off the power supply to conveyor driving device 43 (electric conveyor 42). As a result, both electric conveyors 42 and 110 that deliver accommodation case 90 can be more surely stopped in response to the opening of any one of emergency stop switches 4*sw* and 110*sw*.

However, the configuration for shutting off the power supply to electric conveyor 110 in response to the operation of emergency stop switch 110*sw* is not limited to the one described above, and the configuration for shutting off the power supply to electric conveyor 42 in response to the operation of emergency stop switch 4*sw* is also not limited to the one described above. That is, conveyor power relays 4R and 110R need not necessarily shut off the power supply to electric conveyor 42 or 110 in response to the opening of emergency stop switches 4*sw* and 110*sw*. Furthermore, conveyor power relays 4R and 110R may have a relay drive circuit including a transistor (switching element) or a diode, and current may be applied to coils 4L and 110L from an excitation power supply separately provided in response to the transistor being turned on (conducted) by an electric signal (current signal) from optical communication module 4*co* or 110*co*.

In addition, all emergency stop switches 4*sw* and 110*sw* are normally closed switches; however, the configuration is not limited to this. That is, emergency stop switch 4*sw* may be a relay (switch) or the like opened by control device 40 when any abnormality or the like is detected in storage section 4. Furthermore, emergency stop switch 110*sw* may be a relay (switch) or the like opened by conveyor control device 115 or the like when any abnormality or the like is detected in automated guided vehicle 100 or electric conveyor 110. In addition, both a normally closed switch and a switch opened by control device 40 may be incorporated between input/output module 4*io* and optical communication module 4*co*, and both a normally closed switch and a switch opened by conveyor control device 115 or the like may be incorporated between input/output module 110*io* and optical communication module 110*co*.

Furthermore, a wireless communication module (non-contact type communication module) utilizing an electromagnetic field, a radio wave, or the like may be installed in storage section 4 in place of optical communication module 4*co*, and a wireless communication module (non-contact type communication module) utilizing an electromagnetic field, a radio wave, or the like may be installed in electric conveyor 110 in place of optical communication module 110*co*. In addition, in place of optical communication modules 4*co* and 110*co*, a communication module coupled to each other via a mechanical connector may be used, and input/output module 4*io* and input/output module 110*io* may be connected to each other via a mechanical connector.

In addition, the configuration of accommodation case 90 is not limited to the one described above. Furthermore, the article delivered between electric conveyors 42 and 110 is not limited to accommodation case 90 accommodating multiple feeders 50. That is, at least one feeder 50 may be delivered between electric conveyors 42 and 110 as it is, or a wheeled platform that collectively supports multiple feeders 50 may be delivered between electric conveyors 42 and 110. In addition, the article delivered between electric conveyors 42 and 110 may be tape reel 51 accommodating component P to be mounted on board S, a component tray in which components P to be mounted on board S are arranged, a component container in which components P to be mounted on board S are irregularly accommodated, a container accommodating at least one of a mounting head, a suction nozzle, and a chuck of component mounter 5, a container accommodating at least one of a squeegee, a mask, a printing head, and a dispense head of printing device 2, an accommodation container of solder, or the like.

Furthermore, storage section 4 is incorporated in production line 1 including component mounter 5 for mounting component P on board S; however, the configuration is not limited to this. That is, storage section 4 may be incorporated in a line including only component mounter 5. In addition, storage section 4 may be installed in the outer setup area or the like that is different from the installation area of production line 1. Furthermore, storage section 4 is not limited to a section having two storage spaces 41, but may be a section having one or three or more storage spaces 41.

In addition, electric conveyor 110 is a unit separate from automated guided vehicle 100; however, the configuration is not limited to this. That is, electric conveyor 110 may be integrated with automated guided vehicle 100. Furthermore, traveling control device 105 of automated guided vehicle 100 may be a remote control device that is not mounted on automated guided vehicle 100. In addition, optical communication module 110*co*, input/output module 110*io*, and emergency stop switch 110*sw* may be provided in automated guided vehicle 100.

The present disclosure is by no means limited to the above embodiments, and it goes without saying that various changes can be made within the scope of the extension of the present disclosure. Furthermore, the above embodiments are merely one aspect of the disclosure, and do not limit the elements described in the summary.

INDUSTRIAL APPLICABILITY

The present disclosure can be used in the manufacturing industry of a board on which components are mounted.

REFERENCE SIGNS LIST

1 production line, 2 printing device, 3 print inspection device, 4 storage section, 4*co* optical communication module, 4*io* input/output module, 4L coil, 4R conveyor power relay, 4*sw* emergency stop switch, 40 control device, 41 storage space, 42 electric conveyor, 43 conveyor driving device, 44 clamp mechanism, 44*a* supporting plate, 44*b* moving member, 44*c* claw member, 45 wall section, 46 connector, 47 first case detection sensor, 48 second case detection sensor, 49 power supply, 5 component mounter, 50 feeder, 51 tape reel, 52 tape feeding mechanism, 53 connector, 6 mounting inspection device, 7 reflow device, 8 reflow inspection device, 9 loader, 10 production management device, 90 accommodation case, 91 clamped member, 92 detected member, 93 connector, 100 automated guided vehicle, 101 traveling driving device, 105 traveling control device, 109 battery, 110 electric conveyor, 110*co* optical communication module, 110*io* input/output module, 110L coil, 110R conveyor power relay, 110*sw* emergency stop switch, 111 conveyor driving device, 112 first case detection sensor, 114 second case detection sensor, 115 conveyor control device, L1, La first line, L2, Lb second line, P component, S board, SLT slot, W drive wheel

The invention claimed is:

1. An article delivery system for delivering an article used in production of a board on which a component is mounted between an automated guided vehicle configured to convey the article and a storage section configured to store the article, the system comprising:

a first electric conveyor provided on a side of the automated guided vehicle, and configured to deliver the article between the first electric conveyor and the storage section;

a first communication module provided on the side of the automated guided vehicle, and configured to transmit a first signal to a side of the storage section;

a first emergency stop switch provided on the side of the automated guided vehicle;

a second electric conveyor provided on the side of the storage section, and configured to deliver the article between the second electric conveyor and the first electric conveyor of the automated guided vehicle;

a second communication module provided on the side of the storage section, and configured to transmit a second signal to the side of the automated guided vehicle;

a second emergency stop switch provided on the side of the storage section;

a conveyor control device provided on the side of the automated guided vehicle, connected to the first communication module, the conveyor control device including a processor configured to control the first electric conveyor; and a control device provided on the side of the storage section and connected to the second communication module, the control device including a processor configured to control the storage section, wherein the first and second communication modules are configured to exchange signals with each other, power supply to the first electric conveyor is shut off and the first signal from the first communication module changes in response to operation of the first emergency stop switch, power supply to the second electric conveyor is shut off and the second signal from the second communication module changes in response to operation of the second emergency stop switch, the power supply to the second electric conveyor is shut off in response to a change in the first signal from the first communication module, the power supply to the first electric conveyor is shut off in response to a change in the second signal from the second communication module, and even when the power supply to the first and second electric conveyors is shut off in response to the operation of the first or second emergency stop switch, power supply to the conveyor control device and the control device is continued such that communication between the conveyor control device and the control device is continued via the first and second communication modules.

2. The article delivery system according to claim 1, wherein the first electric conveyor is configured as one unit including the first communication module, the first emergency stop switch, and the conveyor control device, and is mounted on the automated guided vehicle, and the conveyor control device is connected to a control device of the automated guided vehicle so as to exchange information with each other.

3. The article delivery system according to claim 1, wherein power supply to a traveling driving source of the automated guided vehicle is shut off in response to the operation of the first or the second emergency stop switch.

4. The article delivery system according to claim 1, further comprising:

a first signal generation section provided on the side of the automated guided vehicle, and including a first input/output module configured to transmit an electric signal to the first communication module;

a first relay provided on the side of the automated guided vehicle, and configured to shut off the power supply to the first electric conveyor;

a second signal generation section provided on the side of the storage section, and including a second input/output module configured to transmit an electric signal to the second communication module; and a second relay provided on the side of the storage section, and configured to shut off the power supply to the second electric conveyor; wherein the first emergency stop switch is configured to shut off communication between the first signal generation section and the first communication module, the second emergency stop switch is configured to shut off communication between the second signal generation section and the second communication module, the first communication module transmits the first signal based on the electric signal from the first signal generation section to the second communication module, and causes the first relay to shut off the power supply to the first electric conveyor when the second signal from the second communication module changes in response to shut-off of the communication between the second signal generation section and the second communication module by the second emergency stop switch, and the second communication module transmits the second signal based on the electric signal from the second signal generation section to the first communication module, and causes the second relay to shut off the power supply to the second electric conveyor when the first signal from the first communication module changes in response to shut-off of the communication between the first signal generation section and the first communication module by the first emergency stop switch.

5. The article delivery system according to claim 4, wherein the first relay shuts off the power supply to the first electric conveyor in response to the shut-off of the communication between the first signal generation section and the first communication module by the first emergency stop switch, and the second relay shuts off the power supply to the second electric conveyor in response to the shut-off of the communication between the second signal generation section and the second communication module by the second emergency stop switch.

6. The article delivery system according to claim 1, wherein the first and second emergency stop switches include at least one of a normally closed switch and a switch controlled to open in response to detection of an abnormality.

7. The article delivery system according to claim 1, wherein the article is a feeder including a tape accommodating multiple components.

8. The article delivery system according to claim 7, wherein the storage section is incorporated in a production line including a component mounter configured to mount the component on the board.

9. An article delivery method for delivering an article used in production of a board on which a component is mounted between a first electric conveyor on a side of an automated guided vehicle configured to convey the article and a second electric conveyor on a side of a storage section configured to store the article, the method comprising:

exchanging signals between a first communication module on the side of the automated guided vehicle and a second communication module on the side of the storage section when the article is delivered between the first and second electric conveyors;

shutting off power supply to the first electric conveyor in response to operation of a first emergency stop switch on the side of the automated guided vehicle, changing a first signal from the first communication module, and shutting off power supply to the second electric conveyor in response to a change in the first signal; and shutting off the power supply to the second electric conveyor in response to operation of a second emergency stop switch on the side of the storage section, changing a second signal from the second communication module, and shutting off the power supply to the second electric conveyor in response to a change in the second signal, wherein the automated guided vehicle includes a conveyor control device which is connected to the first communication module, the conveyor control device including a processor configured to control the first electric conveyor, wherein the storage section includes a control device pro connected to the second communication module, the control device including a processor configured to control the storage section, and even when the power supply to the first and second electric conveyors is shut off, power supply to the conveyor control device and the control device is continued such that communication between the conveyor control device and the control device is continued via the first and second communication modules.

* * * * *